United States Patent
Chen et al.

(10) Patent No.: US 8,334,198 B2
(45) Date of Patent: Dec. 18, 2012

(54) METHOD OF FABRICATING A PLURALITY OF GATE STRUCTURES

(75) Inventors: Jian-Hao Chen, Hsinchu (TW); Wei-Yang Lee, Taipei (TW); Wei-Yeh Tang, Yangmei (TW); Xiong-Fei Yu, Hsinchu (TW); Kuang-Yuan Hsu, Fongyuan (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/085,029

(22) Filed: Apr. 12, 2011

(65) Prior Publication Data

US 2012/0264281 A1    Oct. 18, 2012

(51) Int. Cl.
    *H01L 21/4763* (2006.01)
(52) U.S. Cl. ............... 438/595; 438/183; 257/E21.444
(58) Field of Classification Search .......... 438/183, 438/926; 257/E21.317, E21.4, E21.453, 257/E21.457, E21.483
See application file for complete search history.

(56) References Cited

U.S. PATENT DOCUMENTS

| 5,960,270 | A  | * | 9/1999  | Misra et al. ............... 438/197 |
| 6,445,047 | B1 | * | 9/2002  | Yamada et al. ............ 257/391 |
| 2008/0087966 | A1 | * | 4/2008  | Tai et al. ................... 257/369 |
| 2008/0258216 | A1 | * | 10/2008 | Kikuchi ...................... 257/344 |
| 2009/0047790 | A1 | * | 2/2009  | Raghu et al. ............... 438/703 |
| 2010/0048011 | A1 | * | 2/2010  | Yeh et al. ................... 438/591 |
| 2010/0129958 | A1 | * | 5/2010  | Chang et al. ............... 438/102 |

\* cited by examiner

*Primary Examiner* — Cheung Lee
(74) *Attorney, Agent, or Firm* — Lowe Hauptman Ham & Berner, LLP

(57) ABSTRACT

The invention relates to integrated circuit fabrication, and more particularly to a semiconductor device with a plurality of gate structures. An exemplary method of fabricating the plurality of gate structures comprises providing a silicon substrate; depositing a dummy oxide layer over the substrate; depositing a dummy gate electrode layer over the dummy oxide layer; patterning the layers to define a plurality of dummy gates; forming nitrogen-containing sidewall spacers on the plurality of dummy gates; forming an interlayer dielectric layer between the nitrogen-containing sidewall spacers; selectively depositing a hard mask layer on the interlayer dielectric layer by an atomic layer deposition (ALD) process; removing the dummy gate electrode layer; removing the dummy oxide layer; depositing a gate dielectric; and depositing a gate electrode.

20 Claims, 10 Drawing Sheets

METHOD OF FABRICATING A PLURALITY OF GATE STRUCTURES

FIELD OF THE INVENTION

The invention relates to integrated circuit fabrication and, more particularly, to a semiconductor device with a plurality of gate structures.

BACKGROUND

As the dimensions of transistors decrease, the thickness of the gate oxide must be reduced to maintain performance with the decreased gate length. However, in order to reduce gate leakage, high dielectric constant (high-k) gate oxide layers are used which allow greater physical thicknesses while maintaining the same effective thickness as would be provided by a typical gate oxide used in future technology nodes.

Additionally, as technology nodes shrink, in some integrated circuit (IC) designs, there has been a desire to replace the typically polysilicon gate electrode with a metal gate electrode to improve device performance with the decreased feature sizes. One process of forming the metal gate electrode is termed a "gate last" process in which the final metal gate electrode is fabricated "last" which allows for reduced number of subsequent processes, including high temperature processing, that must be performed after formation of the gate.

However, there are challenges to implementing such features and processes in complementary metal-oxide-semiconductor (CMOS) fabrication. As the gate length and spacing between devices decrease, these problems are exacerbated. For example, in a "gate last" fabrication process, it is difficult to achieve a perfect isolation between neighboring transistors because unwanted recesses are generated in an interlayer dielectric (ILD) layer after wet/dry etching a dummy gate. The recesses present in the ILD layer can become a receptacle of metals during subsequent processing thereby increasing the likelihood of electrical shorting and/or device failure.

SUMMARY

In one embodiment, a method of fabricating a plurality of gate structures comprises providing a silicon substrate; depositing a dummy oxide layer over the substrate; depositing a dummy gate electrode layer over the dummy oxide layer; patterning the layers to define a plurality of dummy gates; forming nitrogen-containing sidewall spacers on the plurality of dummy gates; forming an interlayer dielectric layer between the nitrogen-containing sidewall spacers; selectively depositing a hard mask layer on the interlayer dielectric layer by an atomic layer deposition (ALD) process; removing the dummy gate electrode layer; removing the dummy oxide layer; depositing a gate dielectric; and depositing a gate electrode.

In another embodiment, a method of fabricating a plurality of gate structures comprises providing a silicon substrate; depositing a dummy oxide layer over the substrate; depositing a dummy gate electrode layer over the dummy oxide layer; patterning the layers to define a plurality of dummy gates; forming nitrogen-containing sidewall spacers on the plurality of dummy gates; forming an interlayer dielectric layer between the nitrogen-containing sidewall spacers; selectively depositing a hard mask layer on the interlayer dielectric layer by an atomic layer deposition (ALD) process; removing the dummy gate electrode layer; removing the dummy oxide layer by exposing the dummy oxide layer to a vapor mixture comprising $NH_3$ and a fluorine-containing compound; depositing a gate dielectric; and depositing a gate electrode.

A detailed description is given in the following embodiments with reference to the accompanying drawings.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DESCRIPTION

Figure 1:
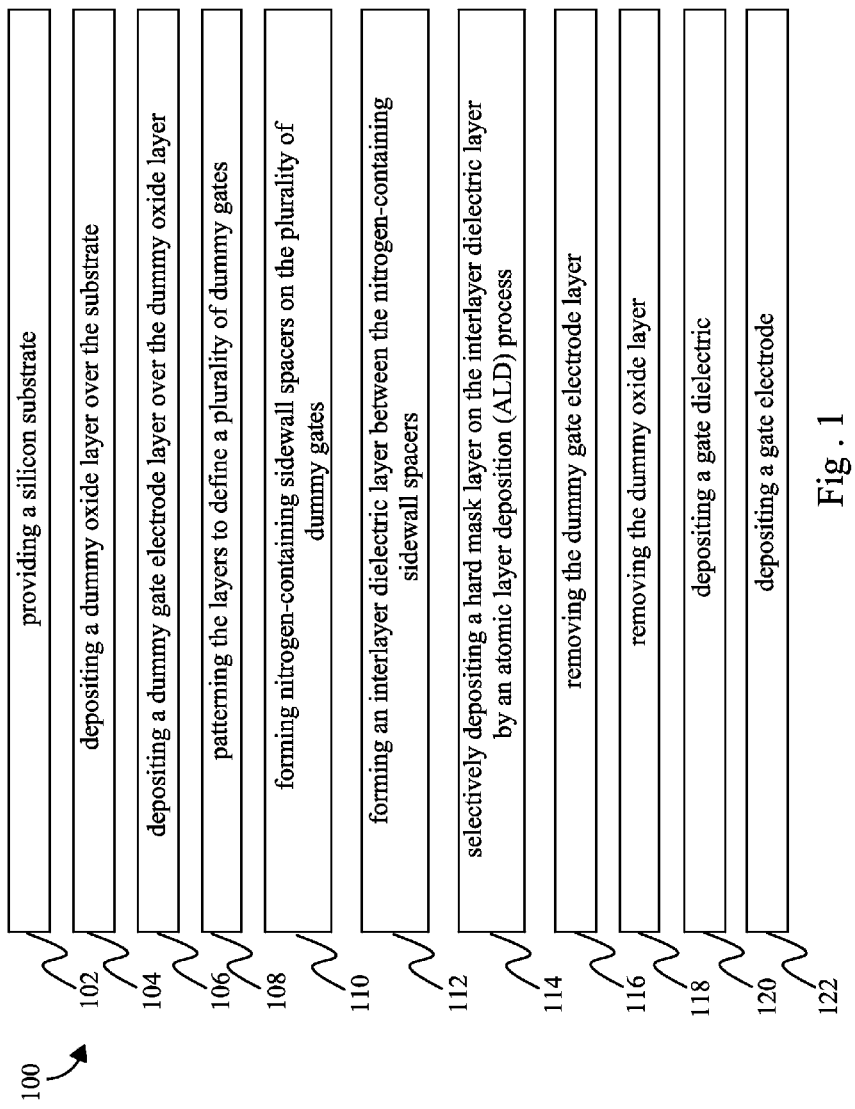
FIG. 1 is a flowchart illustrating a method of fabricating a plurality of gate structures according to various aspects of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a flowchart of a method 100 of fabricating a plurality of gate structures according to various aspects of the present disclosure. The method 100 begins with step 102 in which a silicon substrate is provided. The method 100 continues with step 104 in which a dummy oxide layer is deposited over the substrate. The method 100 continues with step 106 in which a dummy gate electrode layer is deposited over the dummy oxide layer. The method 100 continues with step 108 in which the layers are patterned to define a plurality of dummy gates. The method 100 continues with step 110 in which nitrogen-containing sidewall spacers are formed on the plurality of dummy gates. The method 100 continues with step 112 in which an interlayer dielectric layer is formed between the nitrogen-containing sidewall spacers. The method 100 continues with step 114 in which a hard mask layer is selectively deposited on the interlayer dielectric layer by an atomic layer deposition (ALD) process. The method 100 continues with step 116 in which the dummy gate electrode layer is removed. The method 100 continues with step 118 in which the dummy oxide layer is removed. The method 100 continues with step 120 in which a gate dielectric is deposited. The method 100 continues with step 122 in which a gate electrode is deposited. The discussion that follows illustrates an embodiment of a plurality of gate structures that can be fabricated according to the method 100 of FIG. 1.

Referring to FIGS. 2A-I, illustrated are schematic cross-sectional views of a plurality of gate structures 230 of a semiconductor device 200 at various stages of fabrication according to various aspects of the present disclosure. It is noted that the method of FIG. 1 does not produce a completed semiconductor device 200. A completed semiconductor device 200 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 1 through 21 are simplified for a better understanding of the inventive concepts of the present disclosure. For example, although the figures illustrate a plurality of gate structures 230 for the semiconductor device 200, it is understood the Integrated circuit (IC) may comprise a number of other devices comprising resistors, capacitors, inductors, fuses, etc.

Figure 2A:
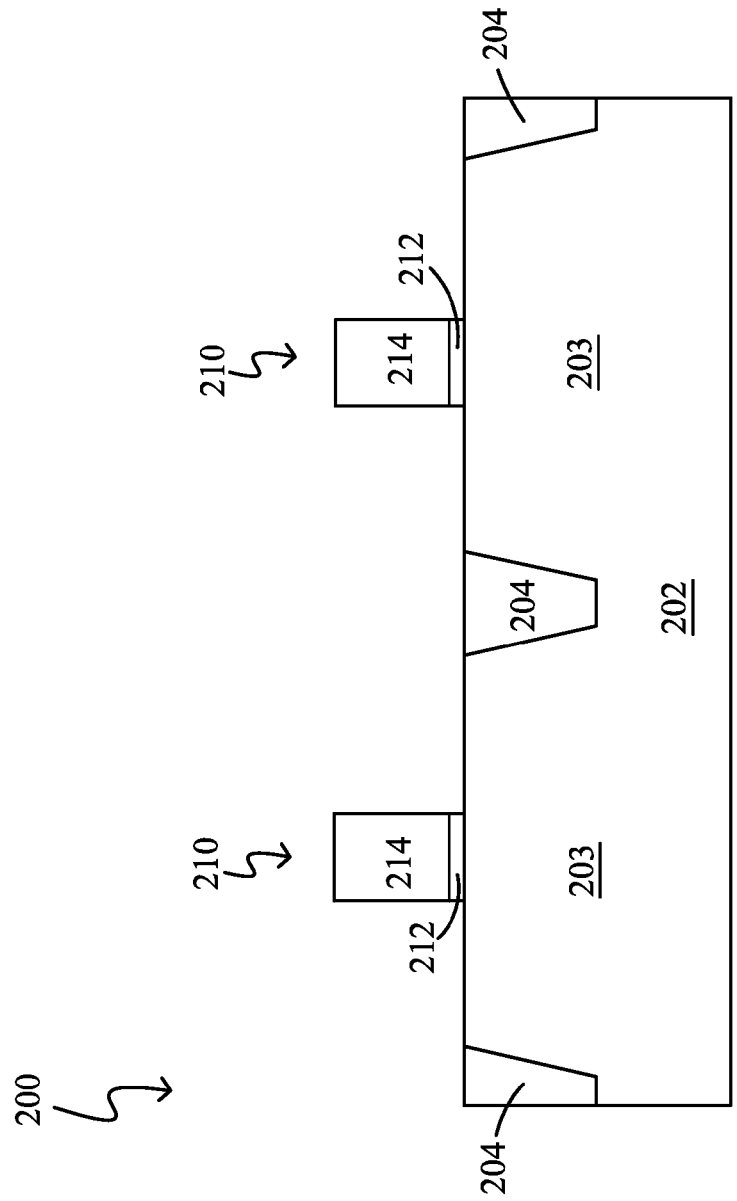
FIGS. 2A-I show schematic cross-sectional views of a plurality of gate structures at various stages of fabrication according to various aspects of the present disclosure.

Referring to FIG. 2A, a substrate 202 comprising active regions 203 and isolation regions 204 is provided. In one embodiment, the substrate 202 comprises a crystalline silicon substrate (e.g., wafer). The substrate 202 may include various doping configurations depending on design requirements (e.g., p-type substrate or n-type substrate). Further, the substrate 202 may include an epitaxial layer (epi layer), may be strained for performance enhancement, and/or may include a silicon-on-insulator (SOI) structure.

The active regions 203 may include various doping configurations depending on design requirements. In some embodiments, the active regions 203 may be doped with p-type or n-type dopants. For example, the active regions 203 may be doped with p-type dopants, such as boron or $BF_2$; n-type dopants, such as phosphorus or arsenic; and/or combinations thereof. The active regions 203 may act as regions configured for an N-type metal-oxide-semiconductor transistor device (referred to as an NMOS) and regions configured for a P-type metal-oxide-semiconductor transistor device (referred to as a PMOS).

The isolation regions 204 may be formed on the substrate 202 to isolate the various active regions 203. The isolation regions 204 may utilize isolation technology, such as local oxidation of silicon (LOCOS) or shallow trench isolation (STI), to define and electrically isolate the various active regions 203. In the present embodiment, the isolation region 204 includes a STI. The isolation regions 204 may comprise silicon oxide, silicon nitride, silicon oxynitride, fluoride-doped silicate glass (FSG), a low dielectric constant (low-k) dielectric material, other suitable materials, and/or combinations thereof. The isolation regions 204, and in the present embodiment, the STI, may be formed by any suitable process. As one example, the formation of the STI may include patterning the semiconductor substrate 202 by a photolithography process, etching a trench in the substrate 202 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Still referring to FIG. 2A, a plurality of dummy gates 210 is then defined by sequentially depositing and patterning a dummy oxide layer 212 and a dummy gate electrode layer 214 on the substrate 202. The plurality of dummy gates 210 may be formed using any suitable process, including the processes described herein. In one example, the dummy oxide layer 212 and dummy gate electrode layer 214 are sequentially deposited on the substrate 202. In the present embodiment, the dummy oxide layer 212 is formed of silicon oxide grown by a thermal oxidation process, having a thickness of about 10 to 50 Å. For example, the dummy oxide layer 212 can be grown by the rapid thermal oxidation (RTO) process or in an annealing process comprising oxygen.

In some embodiments, the dummy gate electrode layer 214 may comprise a single layer or multilayer structure. In the present embodiment, the dummy gate electrode layer 214 may comprise polysilicon. Further, the dummy gate electrode layer 214 may be doped polysilicon with the same or different doping. The dummy gate electrode layer 214 comprises any suitable thickness. In the present embodiment, the dummy gate electrode layer 214 comprises a thickness in the range of about 30 nm to about 80 nm. The dummy electrode layer 214 is formed using a low-pressure chemical vapor deposition (LPCVD) process. The LPCVD process can be carried out in a LPCVD furnace at a temperature of about 580° C. to 650° C. and at a pressure of about 200 mTorr to 1 Torr, using silane ($SiH_4$), disilane ($Si_2H_6$), trisilane ($Si_3H_8$) or dichlorosilane ($SiH_2Cl_2$) as a silicon source gas.

Then, a layer of photoresist (not shown) is formed over the dummy gate electrode layer 214 by a suitable process, such as spin-on coating, and patterned to form a patterned photoresist feature by a proper lithography patterning method. A width of the patterned photoresist feature is in the range of about 15 to 45 nm. The patterned photoresist feature can then be transferred using a dry etching process to the underlying layers (i.e., the dummy oxide layer 212 and the dummy gate electrode layer 214) to define the plurality of dummy gates 210. The photoresist layer may be stripped thereafter.

In another example, a hard mask layer (not shown) is formed over the dummy gate electrode layer 214; a patterned photoresist layer is formed on the hard mask layer; the pattern of the photoresist layer is transferred to the hard mask layer and then transferred to the dummy gate electrode layer 214 and the dummy oxide layer 212 to define the plurality of dummy gates 210. It is understood that the above examples do not limit the processing steps that may be utilized to form the plurality of dummy gates 210. It is further understood that the plurality of dummy gates 210 may comprise additional dielectric layers and/or conductive layers. For example, the plurality of dummy gates 210 may comprise hard mask layers, interfacial layers, capping layers, diffusion/barrier layers, other suitable layers, and/or combinations thereof.

Figure 2B:
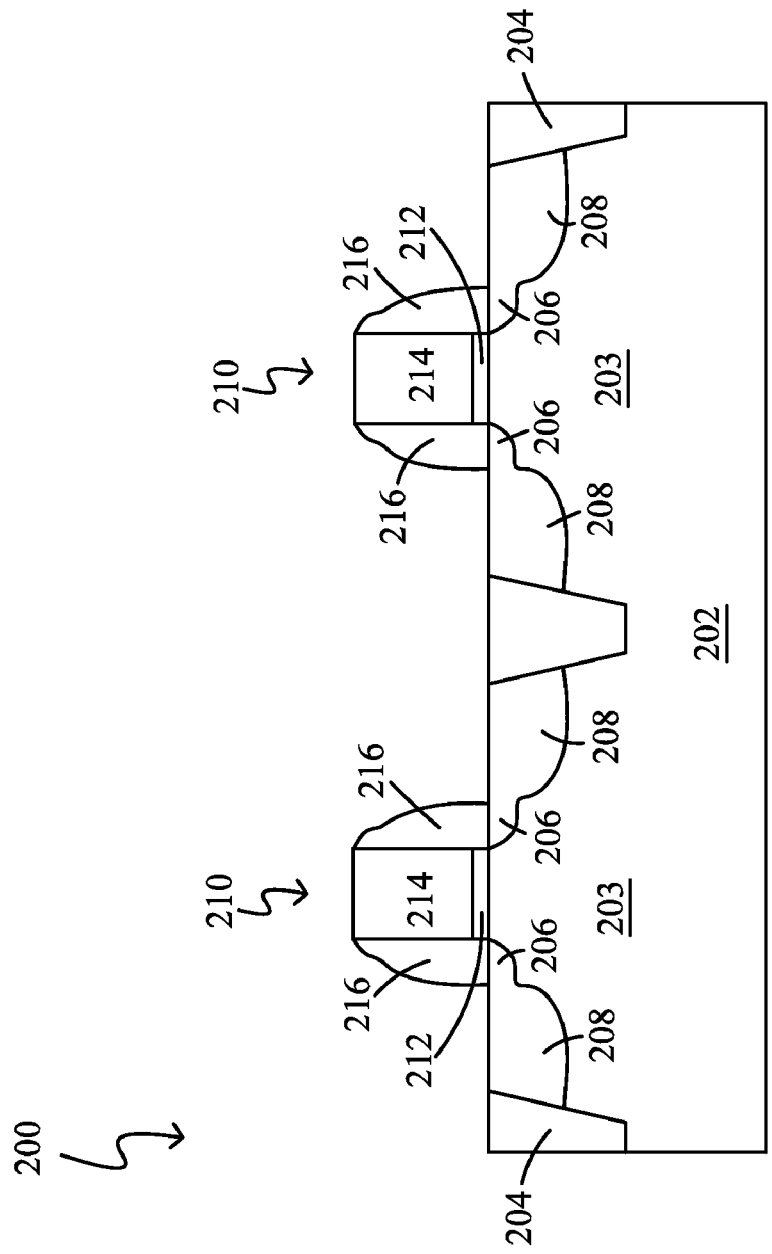

Referring to FIG. 2B, the plurality of dummy gates 210 may be used to offset lightly doped source/drain (LDD) regions 206. The LDD regions 206 may be formed in the active regions 203 of the substrate 202. The LDD regions 206 may be formed in the active regions 203 by one or more implantation processes, such as an ion implantation process. The doping species may depend on the type of device being fabricated, such as an NMOS or PMOS device. For example, the LDD regions 206 may be doped with p-type dopants, such as boron or $BF_2$; n-type dopants, such as phosphorus or arsenic; and/or combinations thereof. The LDD regions 206 may comprise various doping profiles. The LDD regions 206 may be aligned with outer edges of the plurality of dummy gates 210 following the ion implantation process.

After formation of LDD regions 206, a nitrogen-containing dielectric layer 216 is formed on the plurality of dummy gates 210. The nitrogen-containing dielectric layer 216 may be on each side of the plurality of dummy gates 210 and acts as sidewall spacers, and hence may be referred to as nitrogen-containing sidewall spacers 216. The nitrogen-containing sidewall spacers 216 may be formed by plasma deposition at a temperature less than 400° C. and at a pressure of about 200 mTorr to 1 Torr, using $SiH_4$, $NH_3$ and/or $N_2O$ as reaction gases. The sidewall spacers 216 may comprise silicon nitride, silicon oxynitride, silicon carbon nitride, and/or combinations thereof. The sidewall spacers 216 may comprise a multilayer structure. The sidewall spacers 216 comprise any suitable thickness. In the present embodiment, the sidewall spacers 216 comprise a thickness in the range of about 7 nm to about 25 nm.

Still referring to FIG. 2B, the sidewall spacers 216 may be used to offset source/drain (S/D) regions 208 (also referred to as heavily doped source/drain regions). The S/D regions 208 may be formed in the active regions 203 of the substrate 202 by one or more implantation processes, such as an ion implantation process. The doping species may depend on the type of device being fabricated, such as an NMOS or PMOS device. For example, the S/D regions 208 may be doped with p-type dopants, such as boron or $BF_2$; n-type dopants, such as phosphorus or arsenic; and/or combinations thereof. The S/D regions 208 may comprise various doping profiles, and the S/D regions 208 may be aligned with an outer edge of the sidewall spacers 216 following the ion implantation process. The S/D regions 208 may further include raised S/D regions in some embodiments. Also, one or more contact features (e.g., silicide regions) may be formed on the S/D regions 208 by a self-aligned silicidation process.

Figure 2C:
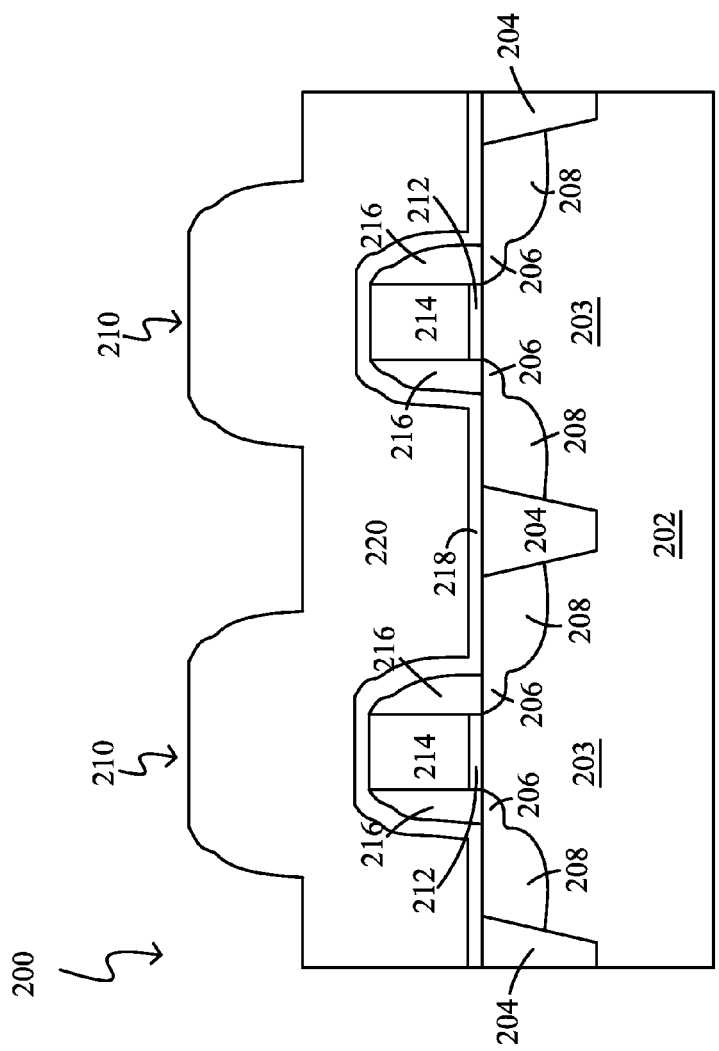

Referring to FIG. 2C, an optional contact etch stop layer (CESL) 218 may be formed over the substrate 202, including over the plurality of dummy gates 210, by any suitable process, including the processes described herein. The CESL 218 may be formed of silicon oxide, silicon nitride, silicon oxynitride, or combinations thereof. The CESL 218 may be formed using a plasma enhanced CVD (PECVD) mixed frequency process. The CESL 218 further comprises any suitable thickness. In the present embodiment, the CESL 218 comprises a thickness of about 200 Å. In some embodiments, the CESL 218 is not used.

Still referring to FIG. 2C, following formation of the CESL 218, an interlayer dielectric (ILD) layer 220 may be formed over the CESL 218. The ILD layer 220 may comprise a dielectric material. The dielectric material may comprise silicon oxide, spin-on glass (SOG), fluorinated silica glass (FSG), carbon doped silicon oxide (e.g., SiCOH), BLACK DIAMOND® (Applied Materials of Santa Clara, Calif.), other suitable dielectric materials, and/or combinations thereof. In some embodiments, the ILD layer 220 may include a high density plasma (HDP) dielectric material (e.g., HDP oxide) and/or a high aspect ratio process (HARP) dielectric material (e.g., HARP oxide). The ILD layer 220 comprises any suitable thickness. In the present embodiment, ILD layer 220 comprises a thickness in the range of about 4000 Å to about 8000 Å. It is understood that the ILD layer 220 may comprise one or more dielectric materials and/or one or more dielectric layers.

Figure 2D:
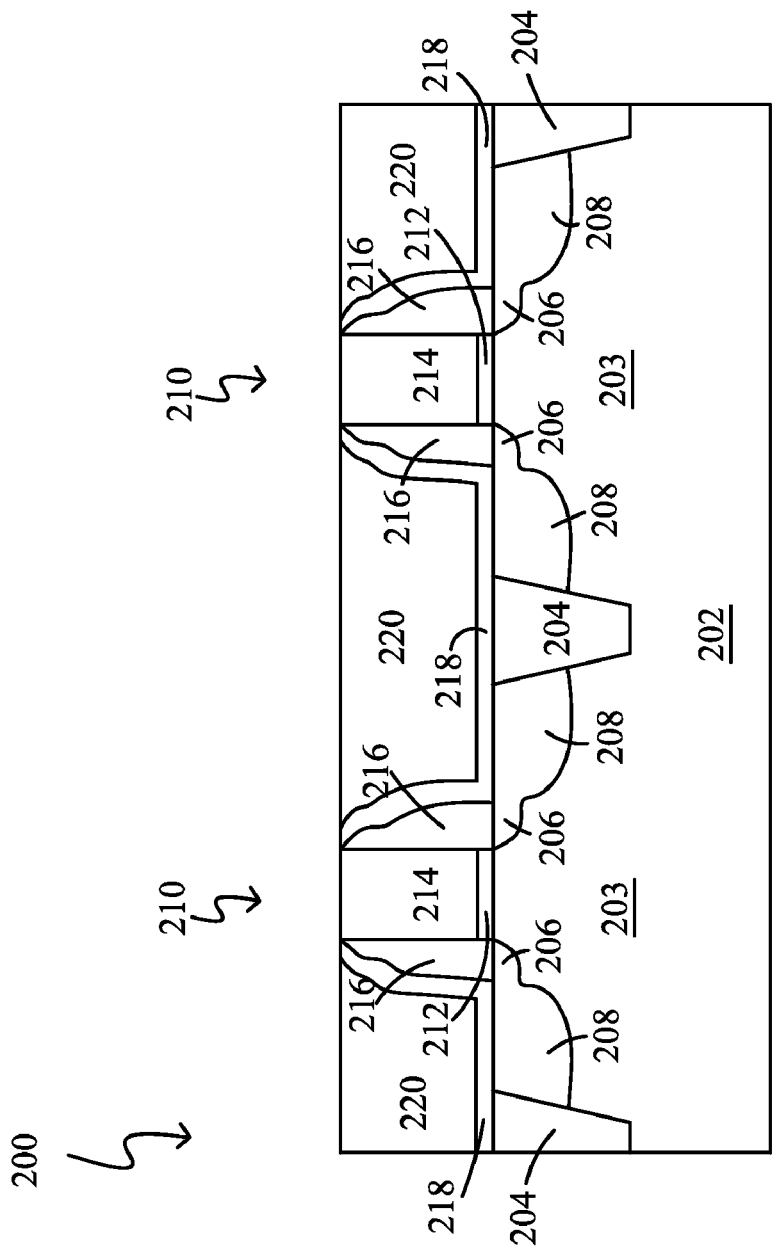

Subsequently, the CESL 218 and/or ILD layer 220 may be planarized by a chemical-mechanical-polishing (CMP) process until top portions of the plurality of dummy gates 210 overlying the substrate 202 is exposed as illustrated in FIG. 2D. The CMP process may have a high selectivity to provide a substantially planar surface for the plurality of dummy gates 210, nitrogen-containing sidewall spacers 216, CESL 218, and ILD layer 220. In the present embodiment, the ILD layer 220 is thus formed between the nitrogen-containing sidewall spacers 216. Further, the plurality of dummy gates 210 may be surrounded with a dielectric layer comprising the nitrogen-containing sidewall spacers 216, CESL 218, and ILD layer 220.

After the CMP process, a gate replacement process is performed. Using a wet etch and/or dry etch process, the plurality of dummy gates 210 may be removed to form an opening for formation of a plurality of gate structures 230 (shown in FIG. 2I). It should be noted that the wet etch and/or dry etch process is especially prone to removal of a portion of the ILD layer 220 to generate unwanted recesses in the ILD layer 220. The unwanted recesses present in the ILD layer 220 become a receptacle of metals during subsequent processing, thereby increasing the likelihood of electrical shorting and/or device failure. Accordingly, the processing discussed below with reference to FIGS. 2E-2I may protect the ILD layer 220 from being damaged during the dummy gates 210 removal. This can reduce unwanted recesses generation in the ILD layer 220 and upgrade device performance.

Figure 2E:
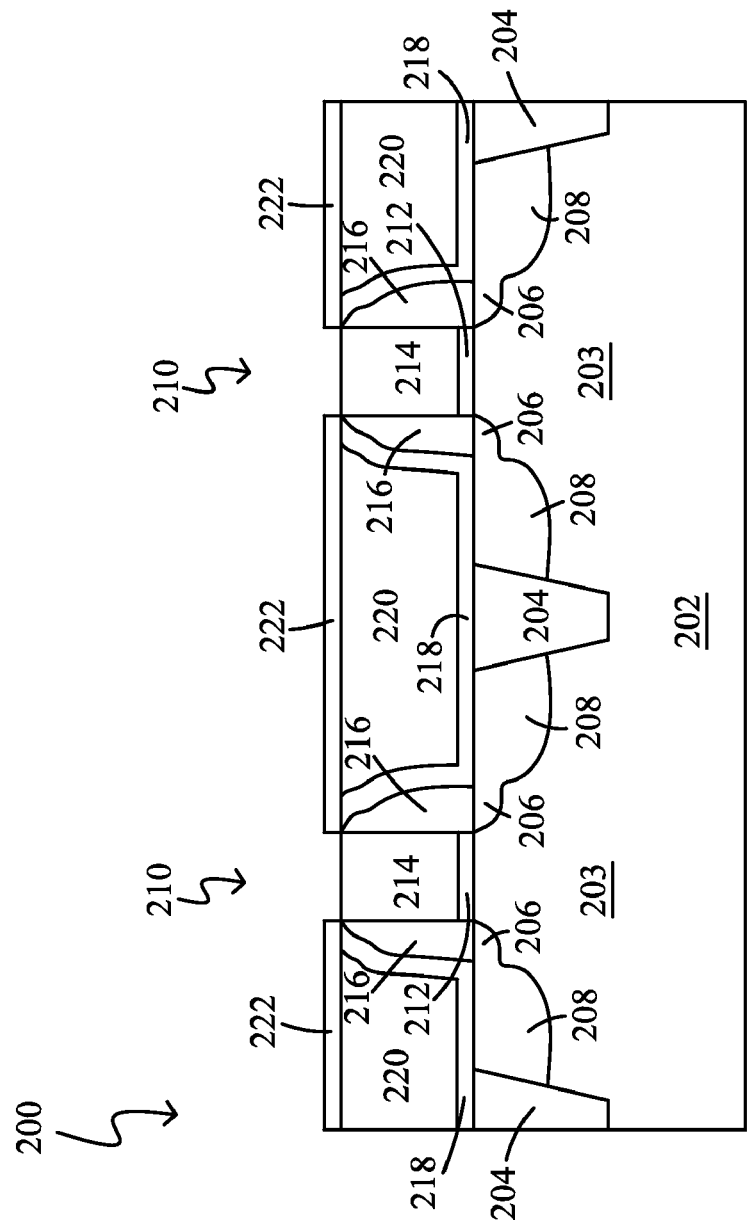

FIG. 2E shows the semiconductor device 200 of FIG. 2D after selectively depositing a hard mask layer 222 on the ILD layer 220 by an atomic layer deposition (ALD) process. The ALD process comprises providing alternating pulses of a metal precursor and a hydroxyl precursor to a reaction chamber. Each pulse of reactants saturates the surface in a self-limiting manner.

An exemplary ALD process in which the hard mask layer 222 is formed comprises the following steps. First, the semiconductor substrate 202 is loaded into a reaction chamber. Then, a pulse of a hydroxyl precursor is injected into the reaction chamber loaded with the semiconductor substrate 202 for a first period of time. Here, the hydroxyl precursor comprises a chemical selected from the group consisting of $H_2O$ and $H_2O_2$. As the hydroxyl precursor is injected into the reaction chamber, a chemisorption layer of the hydroxyl precursor is selectively formed on top surface of the ILD layer 220, but not formed on top surface of the dummy gate electrode layer 214. Then, any residual hydroxyl precursor is discharged from the reaction chamber for a second period of time. To more effectively discharge the residual hydroxyl precursor from the reaction chamber, purge gas may be injected into the reaction chamber during this purging period, wherein the purge gas may include a substantially inert gas such as $N_2$, Ar, He, or similar inert gases.

After discharging the residual hydroxyl precursor from the reaction chamber, a pulse of a metal precursor is injected into the reaction chamber for a third period of time. Here, the metal precursor possesses a high reaction probability with the chemisorption layer of the hydroxyl precursor. As one example, the metal precursor comprises a tetrachloro transition metal complex. In the present embodiment, the tetrachloro transition metal complex comprises a chemical selected from the group consisting of $ZrCl_4$, $HfCl_4$, and $TiCl_4$. The metal precursor reacts with the chemisorption layer of the hydroxyl precursor at a temperature of about 120° C. to 300° C. As a result, an atomic layer of the hard mask layer 222 is formed on top surface of the ILD layer 220, but not formed on top surface of the dummy gate electrode layer 214. In the present embodiment, the hard mask layer 222 comprises a metal oxide. In one embodiment, the metal oxide comprises a material selected from the group consisting of zirconium oxide, hafnium oxide, or titanium oxide.

Then, any residual metal precursor is discharged from the reaction chamber for a fourth period of time. To more effectively discharge the residual metal precursor from the reaction chamber during this second purging period, a substantially inert gas such as $N_2$, Ar, He, or the like may be injected into the reaction chamber.

Normally, the ALD process comprises a sequence of ALD cycles, i.e., the first through fourth time periods, as described above, during which each of the hydroxyl precursor and the metal precursor is alternately injected into and thereafter discharged from the reaction chamber, when taken together are regarded as one deposition or layer formation cycle. By repeating this cycle multiple times, the hard mask layer 222 with a desired thickness is thereby formed. The hard mask layer 222 may have a thickness of about 1 nm to 4 nm. After the deposition process, the hard mask layer 222 is formed on top surface of the ILD layer 220 to protect the ILD layer 220 during dummy gate 210 etching, but not formed on top surface of the dummy gate electrode layer 214.

Figure 2F:
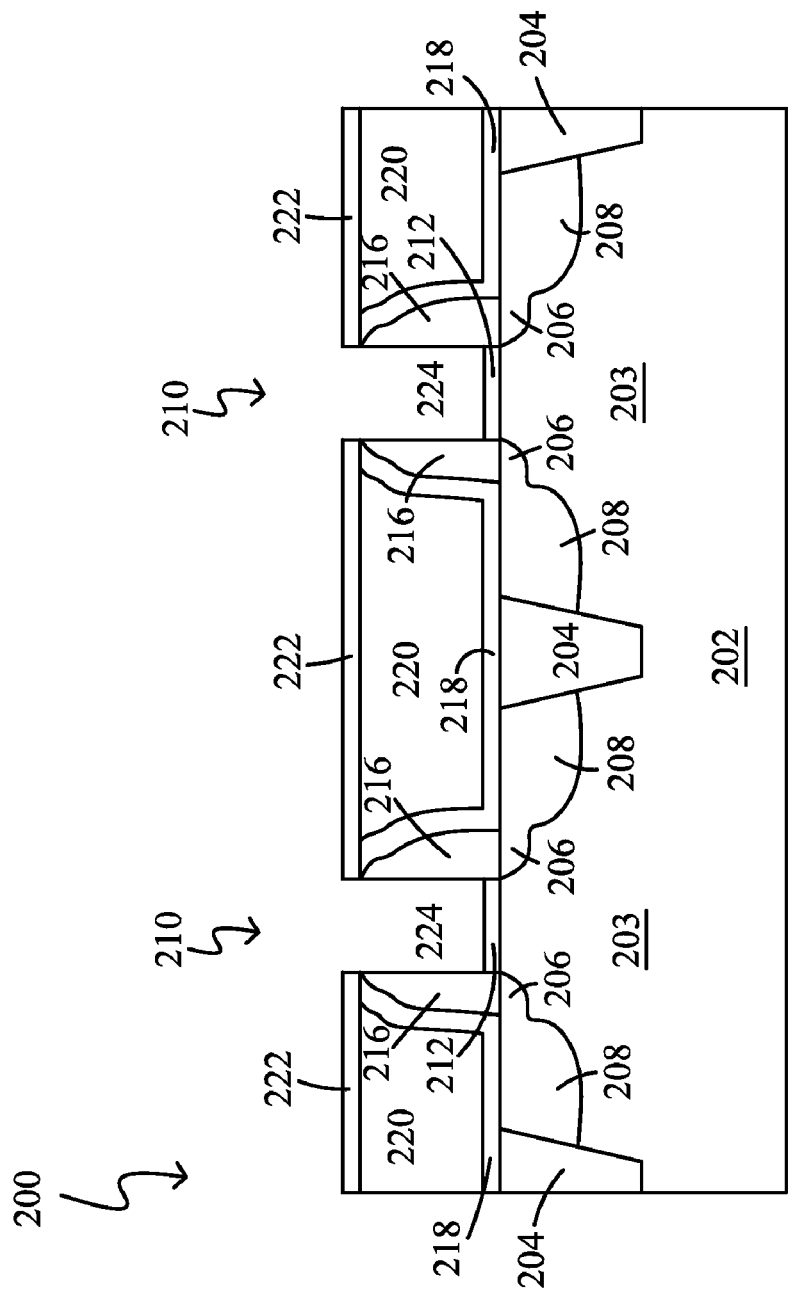

Referring to FIG. 2F, following selective deposition of the hard mask layer 222 on the ILD layer 220, the dummy gate electrode layer 214 may be removed from the plurality of the dummy gates 210 surrounded with the nitrogen-containing sidewall spacers 216 and ILD layer 220. The dummy gate electrode layer 214 may be removed to form an opening 224 in the nitrogen-containing sidewall spacers 216 by any suitable process, including the processes described herein. The dummy gate electrode layer 214 may be removed using a wet etch and/or a dry etch process. In one embodiment, the wet etch process for dummy polysilicon gate electrode layer 214 includes exposure to a hydroxide solution containing ammonium hydroxide, diluted HF, deionized water, and/or other suitable etchant solutions. In other embodiments, the dry etch process for dummy polysilicon gate electrode layer 214 may be performed under a source power of about 650 to 800 W, a bias power of about 100 to 120 W, and a pressure of about 60 to 200 mTorr, using $Cl_2$, HBr, and He as etching gases.

Figure 2G:
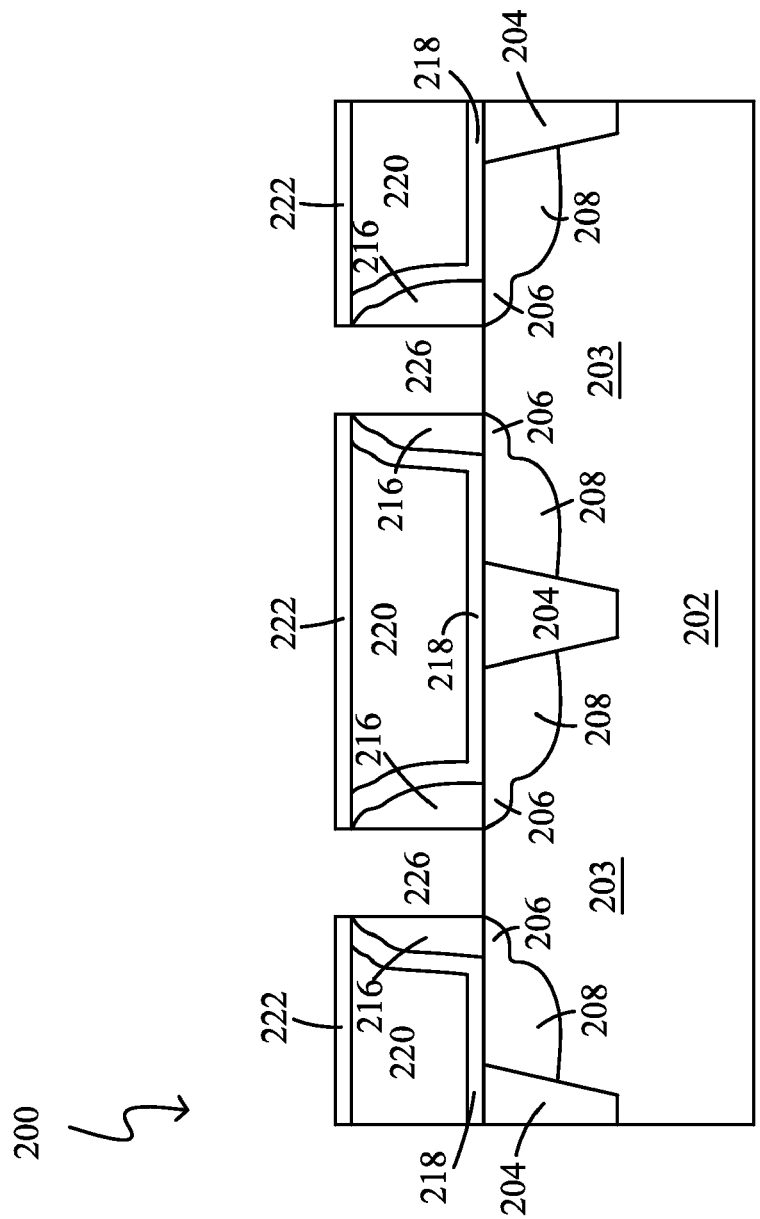

Referring to FIG. 2G, after removal of the dummy gate electrode layer 214, the dummy oxide layer 212 is removed by a wet or vapor phase etching process. In one embodiment, the wet etching process for the dummy oxide layer 212 is performed using a HF-containing solution. The HF-containing solution preferably etches the dummy oxide layer 212 so that little or none of the sidewall spacers 216 and hard mask layer 222 are removed, thereby protecting the ILD layer 220. Therefore, the method for fabricating a gate structure creates almost no recess in the ILD layer 220.

In another embodiment, the vapor phase etching process starts with introducing the structure of FIG. 2F into a sealed reaction chamber in which the vapor phase etching process uses gas phase reactants. The etching process is self-limiting, in that amount of material removed is determined by amount of the gas phase reactants introduced into the reaction chamber. In some embodiments, the vapor phase etching process is performed by exposing the dummy oxide layer 212 to a vapor mixture comprising $NH_3$ and a fluorine-containing compound.

The fluorine-containing compound may be a compound selected from the group of HF or $NF_3$. In one embodiment, the vapor mixture comprises $NH_3$ and HF and is performed at a pressure between 10 mTorr and 25 mTorr. The vapor mixture of $NH_3$ and HF comprises a ratio of $NH_3$ to HF between about 0.1 to 10 by volume. In another embodiment, the vapor mixture comprises $NH_3$ and $NF_3$ and is performed at a pressure between 2 Torr and 4 Torr. The vapor mixture of $NH_3$ and $NF_3$ comprises a ratio of $NH_3$ to $NF_3$ between about 0.5 to 5 by volume. The vapor mixture may further comprise a carrier gas, such as an inert gas. The inert gas comprises $N_2$, He, or Ar.

The vapor mixture preferably etches the dummy oxide layer 212 so that little or none of the sidewall spacers 216 and hard mask layer 222 are removed. Accordingly, at the end of the vapor phase etching process shown in FIG. 2G, the vapor phase etching process may fully remove the dummy oxide layer 212, exposing the silicon substrate 202, and forming an opening 226 in the nitrogen-containing sidewall spacers 216. Therefore, the method for fabricating a gate structure creates almost no recess in the ILD layer 220.

Figure 2H:
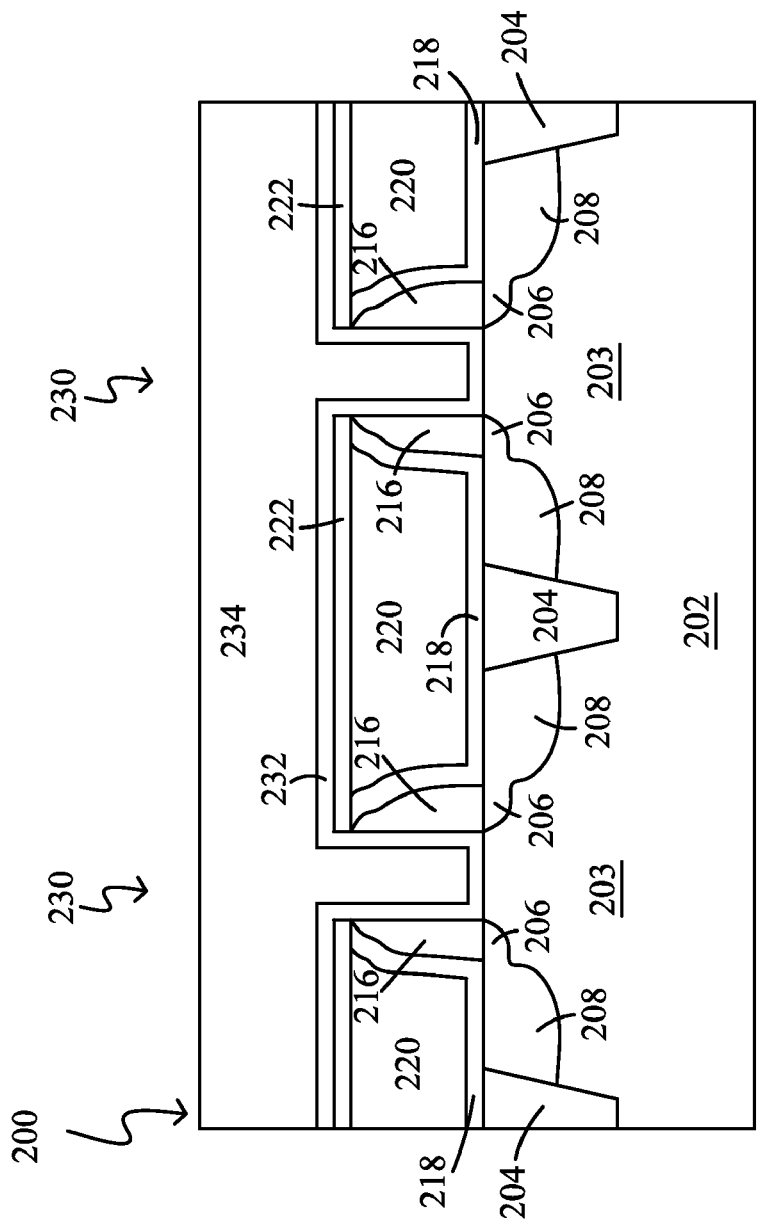

Referring to FIG. 2H, following removal of the dummy oxide layer 212, a gate dielectric 232 and a gate electrode 234 may be deposited to completely fill the opening 226 to form a plurality of gate structures 230. In some embodiments, the gate dielectric 232 may comprise silicon oxide, silicon oxynitride, high-k dielectric layer or a combination thereof. A high-k dielectric material is defined as a dielectric material with a dielectric constant greater than that of $SiO_2$ (i.e., greater than 3.9). The high-k dielectric layer comprises a metal oxide. The metal oxide is selected from the group consisting of oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. The high-k dielectric layer 232 has a thickness of about 1 nm to about 4 nm. The gate dielectric layer 232 may further comprise an interfacial layer to reduce damages between the gate dielectric 232 and the substrate 202. The interfacial layer may comprise silicon oxide. In some embodiments, the gate electrode 234 comprises a material selected from a group of Al, Cu, AiTi, TiN, TiCN, TaN, TaCN, WN and WCN.

Figure 2I:
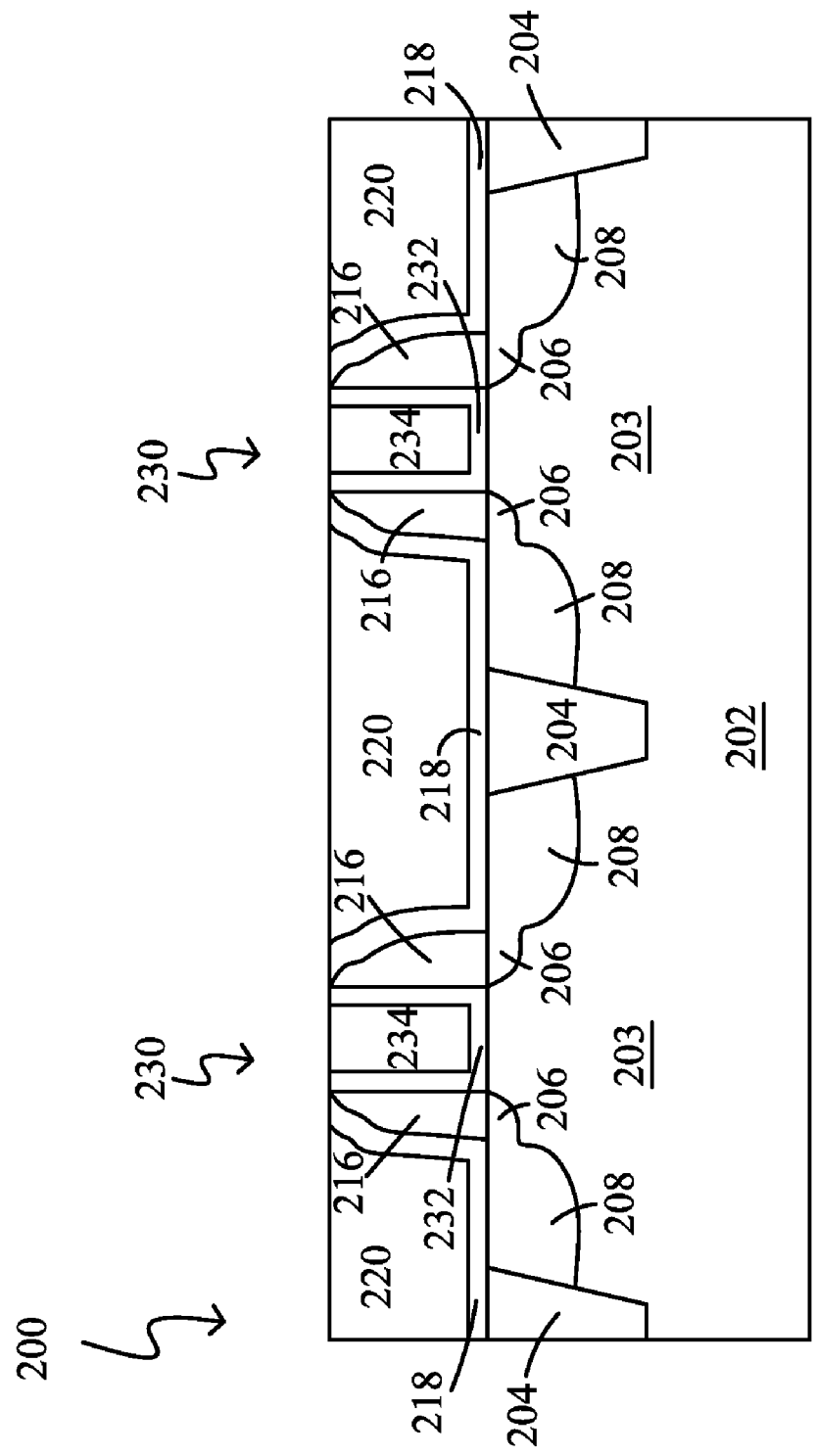

FIG. 2I shows the substrate 202 of FIG. 2H after a planarization process, such as a chemical-mechanical-polishing (CMP) process. The CMP process may remove a portion of the gate electrode 234, gate dielectric 232, and hard mask layer 222 until the top surface of the ILD layer 220 is reached. The remaining gate electrode 234 and gate dielectric 232 are combined and hereinafter referred to as a plurality of gate structures 230. Then, subsequent processes, including interconnect processing, must be performed after forming the plurality of gate structures 230 to complete the semiconductor device 200 fabrication.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a plurality of gate structures, comprising:
   providing a silicon substrate;
   depositing a dummy oxide layer over the substrate;
   depositing a dummy gate electrode layer over the dummy oxide layer;
   patterning the layers to define a plurality of dummy gates;
   forming nitrogen-containing sidewall spacers on the plurality of dummy gates;
   forming an interlayer dielectric layer between the nitrogen-containing sidewall spacers;
   selectively depositing a hard mask layer on the interlayer dielectric layer by an atomic layer deposition (ALD) process, wherein the hard mask layer is not formed over the plurality of dummy gates;
   removing the dummy gate electrode layer;
   removing the dummy oxide layer, wherein removing the dummy oxide layer comprises exposing the dummy oxide layer to a vapor mixture at a pressure between 10 mTorr and 25 mTorr;
   depositing a gate dielectric over the hard mask layer;
   depositing a gate electrode over the gate dielectric and the hard mask layer; and
   removing portions of the gate dielectric, portions of the gate electrode and the hard mask layer using a planarization process.

2. The method of claim 1, wherein the ALD process comprises a sequence of ALD cycles.

3. The method of claim 1, wherein the ALD process comprises providing alternating pulses of a metal precursor and a hydroxyl precursor to a reaction chamber.

4. The method of claim 3, wherein the metal precursor comprises a tetrachloro transition metal complex.

5. The method of claim 4, wherein the tetrachloro transition metal complex comprises a chemical selected from the group consisting of $ZrCl_4$, $HfCl_4$, and $TiCl_4$.

6. The method of claim 3, wherein the hydroxyl precursor comprises a chemical selected from the group consisting of $H_2O$ and $H_2O_2$.

7. The method of claim 1, wherein the ALD process is performed at a temperature of about 120° C. to 300° C.

8. The method of claim 1, wherein the hard mask layer comprises a metal oxide.

9. The method of claim 8, wherein the metal oxide comprises a material selected from the group consisting of zirconium oxide, hafnium oxide, or titanium oxide.

10. The method of claim 1, wherein the nitrogen-containing dielectric layer comprises silicon nitride or silicon oxynitride.

11. The method of claim 1, wherein the step of removing the dummy oxide layer is performed by exposing the dummy oxide layer to a vapor mixture comprising $NH_3$ and a fluorine-containing compound.

12. The method of claim 11, wherein the fluorine-containing compound is a compound selected from the group of HF and $NF_3$.

13. The method of claim 11, wherein the vapor mixture comprises $NH_3$ and HF.

14. The method of claim 11, wherein the vapor mixture further comprises a carrier gas.

15. The method of claim 14, wherein the carrier gas comprises an inert gas.

16. The method of claim 15, wherein the inert gas comprises $N_2$, He, or Ar.

17. The method of claim 1 further comprising removing the hard mask layer after depositing the gate electrode.

18. A method of fabricating a plurality of gate structures, comprising:
    providing a silicon substrate;
    depositing a dummy oxide layer over the substrate;
    depositing a dummy gate electrode layer over the dummy oxide layer;
    patterning the layers to define a plurality of dummy gates;
    forming nitrogen-containing sidewall spacers on the plurality of dummy gates;
    forming a contact etch stop layer over the silicon substrate and the plurality of dummy gates;
    forming an interlayer dielectric layer between the nitrogen-containing sidewall spacers;
    selectively depositing a hard mask layer on the interlayer dielectric layer by an atomic layer deposition (ALD) process, wherein the hard mask layer is not formed over the plurality of dummy gates;
    removing the dummy gate electrode layer;
    removing the dummy oxide layer;
    depositing a gate dielectric over the hard mask layer;
    depositing a gate electrode over the gate dielectric and the hard mask layer; and
    removing portions of the gate dielectric, portions of the gate electrode and the hard mask layer using a planarization process.

19. The method of claim 18, wherein the step of removing the dummy oxide layer is performed by exposing the dummy oxide layer to a vapor mixture comprises $NH_3$ and $NF_3$.

20. The method of claim 19, wherein the step of exposing the dummy oxide layer to a vapor mixture is performed at a pressure between 2 Torr and 4 Torr.

* * * * *